(12) United States Patent
Augst et al.

(10) Patent No.: US 11,152,243 B2
(45) Date of Patent: Oct. 19, 2021

(54) DEVICE FOR ALIGNING AND OPTICALLY INSPECTING A SEMICONDUCTOR COMPONENT

(71) Applicant: Muehlbauer GmbH & Co. KG, Roding (DE)

(72) Inventors: Franz Uwe Augst, Wackersdorf (DE); Benjamin Holzner, Oberviechtach (DE)

(73) Assignee: MUEHLBAUER GMBH & CO. KG, Roding (DE)

( * ) Notice: Subject to any disclaimer, the term of this patent is extended or adjusted under 35 U.S.C. 154(b) by 59 days.

(21) Appl. No.: 16/648,601

(22) PCT Filed: Aug. 31, 2018

(86) PCT No.: PCT/EP2018/073476
§ 371 (c)(1),
(2) Date: Mar. 18, 2020

(87) PCT Pub. No.: WO2019/057469
PCT Pub. Date: Mar. 28, 2019

(65) Prior Publication Data
US 2020/0266086 A1     Aug. 20, 2020

(30) Foreign Application Priority Data
Sep. 21, 2017   (DE) .......................... 102017008869.1

(51) Int. Cl.
*H01L 21/68* (2006.01)
*B65G 47/86* (2006.01)
(Continued)

(52) U.S. Cl.
CPC ............ *H01L 21/681* (2013.01); *B23P 19/00* (2013.01); *B65G 47/847* (2013.01); *H05K 13/081* (2018.08); *H05K 13/0815* (2018.08)

(58) Field of Classification Search
None
See application file for complete search history.

(56) References Cited

U.S. PATENT DOCUMENTS

| 4,619,043 A | 10/1986 | Takahashi et al. |
| 5,750,979 A | 5/1998 | Yamamoto et al. |

(Continued)

FOREIGN PATENT DOCUMENTS

| DE | 4024642 A1 | 2/1992 |
| DE | 4232902 A1 | 3/1994 |

(Continued)

*Primary Examiner* — Gerald McClain
(74) *Attorney, Agent, or Firm* — Shumaker, Loop & Kendrick, LLP; John A. Miller

(57) ABSTRACT

A device for aligning and optically inspecting a semiconductor component arranged on a receiving tool that is arranged on a turning mechanism. The device aligns the semiconductor component in relation to a center of the receiving tool in at least one axis direction and/or a direction of rotation. The turning mechanism is designed to rotate about a turning axis and to move the semiconductor component out of a receiving position into an offset position, with two slides that can be moved towards and away from each other and comprise slide sections, the two slide sections coming to rest on two lateral surfaces of the semiconductor component, at least in sections, in order to align the semiconductor component arranged on the receiving tool, the slide being defined such that it slides and/or rotates the semiconductor component into an inspection position, while the receiving tool holds the semiconductor component.

14 Claims, 2 Drawing Sheets

(51) Int. Cl.
*H05K 13/08* (2006.01)
*B23P 19/00* (2006.01)

(56) References Cited

U.S. PATENT DOCUMENTS

| | | |
|---|---|---|
| 7,191,511 B2 | 3/2007 | Noda et al. |
| 9,510,460 B2 * | 11/2016 | Cheung .............. H05K 13/0813 |
| 10,473,714 B2 * | 11/2019 | Cheng ................. G01R 31/2891 |
| 10,804,123 B2 * | 10/2020 | Junker .................... H01L 24/75 |
| 2016/0081198 A1 * | 3/2016 | Cheung .............. H05K 13/0813 |
| | | 29/593 |

FOREIGN PATENT DOCUMENTS

| | | |
|---|---|---|
| DE | 19913134 A1 | 10/1999 |
| DE | 102006020513 A1 * | 11/2007 |
| DE | 102014116342 A1 | 5/2016 |
| DE | 102015013494 B3 | 4/2017 |
| EP | 0906011 A2 | 3/1999 |
| EP | 1126507 A2 | 8/2001 |
| EP | 2075829 B1 | 7/2009 |
| EP | 1470747 B1 | 5/2014 |
| JP | H02193813 A | 7/1990 |
| JP | H08227904 A | 9/1996 |
| JP | H1193630 A | 4/1999 |
| JP | 2001074664 A | 3/2001 |
| JP | 2007095725 A | 4/2007 |
| JP | 4911714 B2 | 4/2012 |
| JP | 2012116529 A | 6/2012 |
| JP | 5510923 B2 | 6/2014 |
| JP | 5783652 B2 | 9/2015 |
| WO | 02054480 A1 | 7/2002 |
| WO | 2012073285 A1 | 6/2012 |
| WO | 2013084298 A1 | 4/2015 |
| WO | 2013108398 A1 | 5/2015 |
| WO | 2015083211 A1 | 6/2015 |
| WO | 2014112041 A1 | 1/2017 |
| WO | 2017022074 A1 | 2/2017 |

* cited by examiner

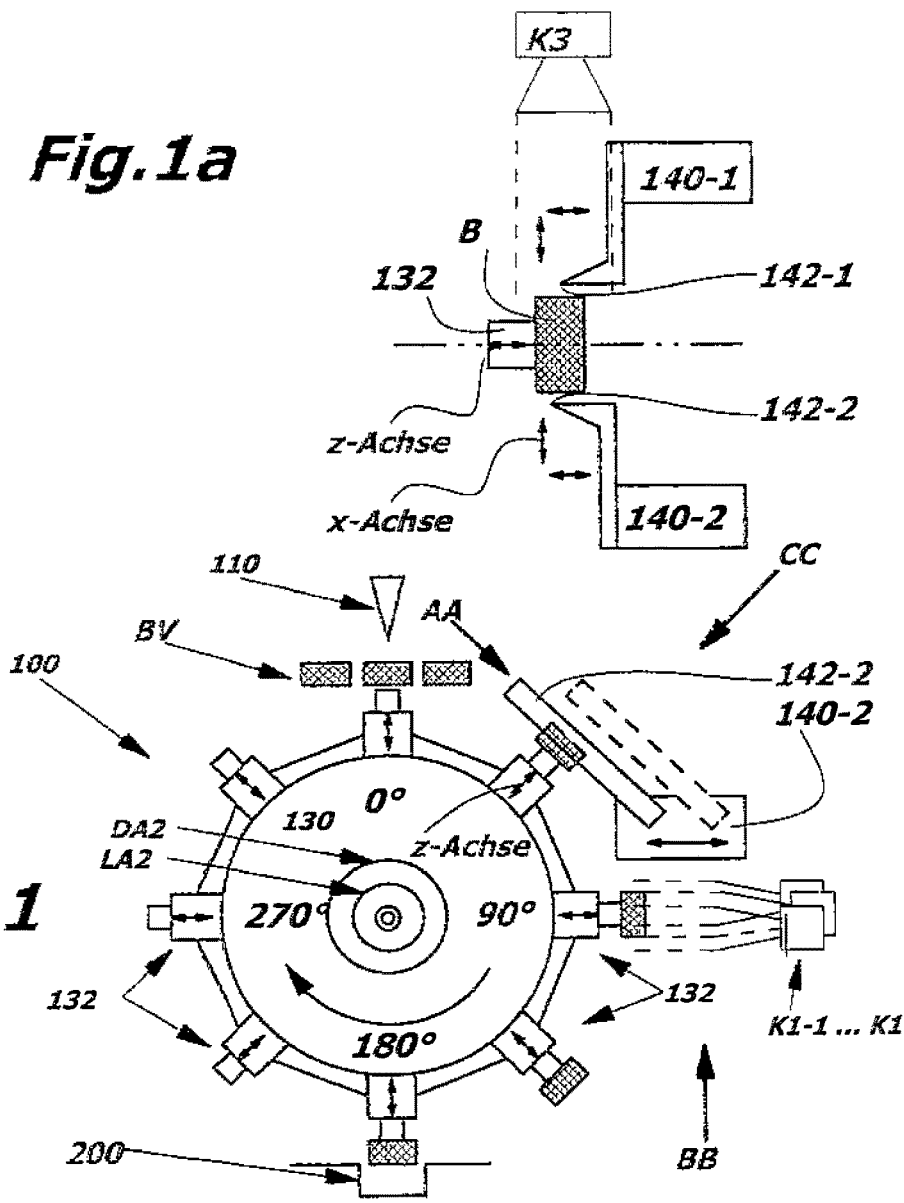
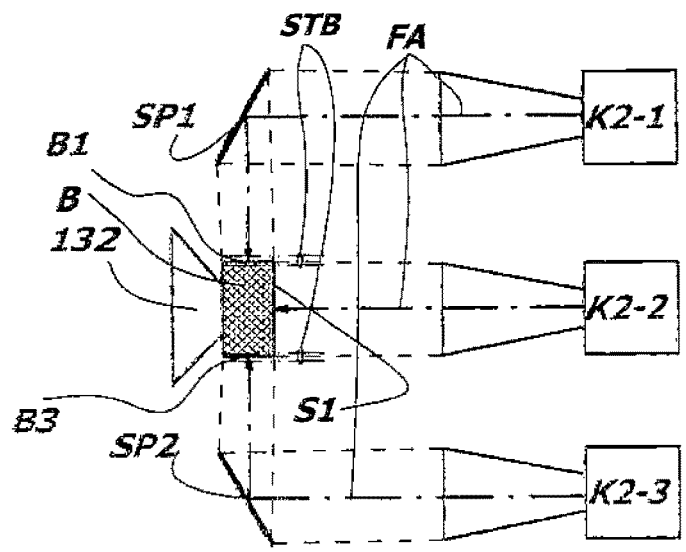

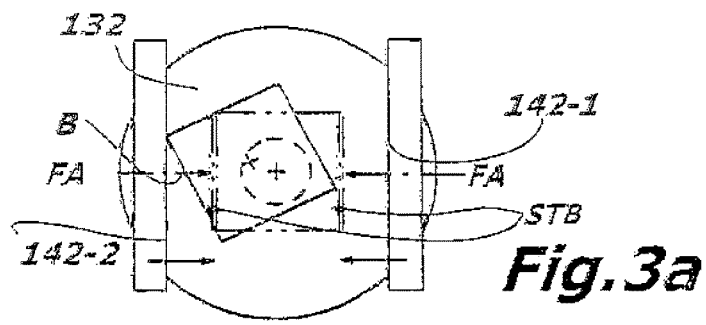
Fig.3a
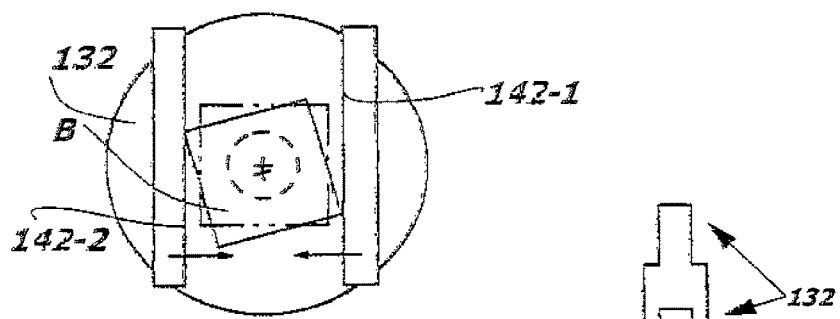
Fig.3b
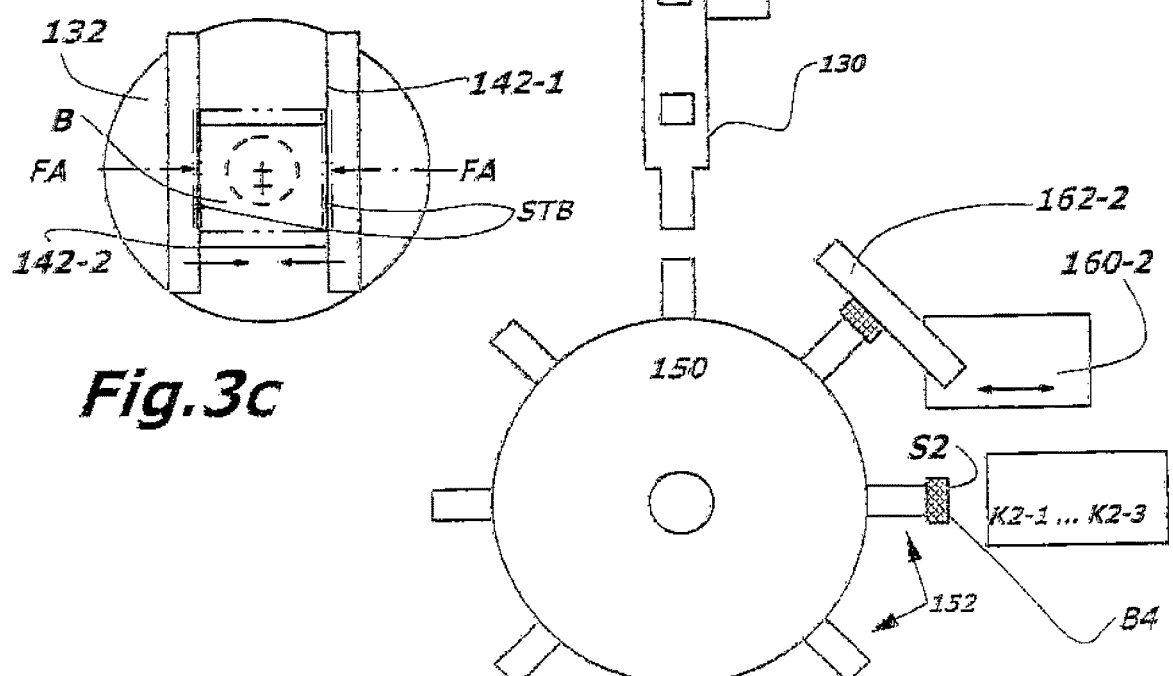
Fig.3c
Fig.2

DEVICE FOR ALIGNING AND OPTICALLY INSPECTING A SEMICONDUCTOR COMPONENT

CROSS-REFERENCE TO RELATED APPLICATIONS

This application is a National Stage application of International Application No. PCT/EP2018/073476 filed Aug. 31, 2018, which claims priority to German Patent Application Serial No. DE 10 2017 008 869.1, filed Sep. 21, 2017.

BACKGROUND

Field

There is described herein a component centering means for a component-handling device. This component centering means is explained in conjunction with the component-handling device. Details thereof are defined in the claims; the description and the drawing also contain relevant details of the system and the mode of functioning and also of variants of the system.

Discussion

A component is here, for example, a (an electronic) semiconductor component, also referred to as a "chip" or "die". Such a component generally has a prismatic form, a substantially polygonal, for example quadrangular (rectangular or square), cross-section with a plurality of lateral faces as well as a top face and an end face. The lateral faces and also the two (lower and upper) end faces of the component are generally referred to as side faces hereinbelow. The component may also have a number of lateral faces other than four. A component may also be an optical component (prism, mirror, lens, etc.). Overall, a component may have any geometric shape.

From the operational practice of the applicant there are known so-called pick-up and set-down devices in which components are picked up from a substrate by means of a pick-up tool and subsequently deposited on a support or in a transport container or the like. Before the component is deposited, an inspection of the component usually takes place. For that purpose, images of one or more side faces of the component are recorded by one or more cameras and evaluated by means of automated image processing.

EP 1 470 747 B1 relates to a chip removal device, a chip removal system, a fitting system, and a method for removing and further processing chips. The chips are removed from a wafer and transported to a transfer position and at the same time turned. This chip removal device for removing chips from structured semiconductor wafers is equipped with a rotatable removal tool for removing the chips from the wafer and for turning the removed chips through 180° about their longitudinal or transverse axis, and a rotatable turning tool for again turning the removed chips through 180° about their longitudinal or transverse axis, which turning tool cooperates with the removal tool. The removal tool has a first transfer position and the turning tool has a second transfer position, at which the chips can be transferred to a fitting head for further processing.

EP 0 906 011 A2 relates to a device for removing and equipping electrical components on a substrate. The device comprises a rotatable transfer device which removes the electrical components from a feed module at a pick-up position and transfers them to a suction belt for further processing at a first transfer position. By means of a rotatable equipping head, the components are picked up from the suction belt and transported to a second transfer position.

WO 02/054480 A1 relates to a device for optically inspecting various surfaces of a chip that is to be mounted. The device comprises a first, upper transport plate which is adapted to remove the chips from a feed unit and transport them to a first transfer position. The chips are held in suction openings, which are formed in the lateral face of the upper transport drum, and moved by rotation of the upper transport plate. The device further has a second, lower transport plate, of the same design as the first transport plate, which picks up the removed chips at the first transfer position and transports them to a second transfer position. The device allows the chips to be inspected in that cameras are arranged laterally next to the transport plates, which cameras inspect the chips on their upper and lower sides. The chips are further transferred, without being turned relative to their original orientation, to a sorting device for further processing.

U.S. Pat. No. 4,619,043 discloses an apparatus and a method for removing and mounting electronic components, in particular chips, on a circuit board. The apparatus comprises a conveying means for picking up the chips in pick-up units and for transporting the picked up chips to a first transfer position. The conveying means has a conveying chain and a rotatable sprocket, which are in engagement with one another. The apparatus further comprises a rotatable fixing tool with mounting heads for picking up the chips at the first transfer position. The fixing tool is further adapted to convey the picked up chips to a second transfer position by means of a rotational movement, whereby the chips are turned.

JP 2-193813 relates to an apparatus for picking up and turning electronic components, which are inspected by testing apparatuses. The apparatus comprises a feed unit from which chip-like electronic components are removed by a first rotating body and arranged at the periphery thereof. By means of a rotational movement of the rotating body, the electronic components are transported to a first transfer position, whereby they are turned about their longitudinal or transverse axis. The apparatus further comprises a second rotating body which picks up the removed electronic components at the first transfer position and transports them to a second transfer position. The electronic components are thereby further turned about their longitudinal or transverse axis. The apparatus thus allows different sides of the components to be inspected.

DE 102014116342 A1 relates to a method and a substrate holding device, comprising a carrier plate with a recess for receiving at least one holding frame for holding a substrate by means of the at least one holding frame in the recess, wherein the recess extends through the carrier plate from its upper side to its lower side. The carrier plate has a centering region, in which an opening width of the recess reduces continuously from the upper side in the direction towards the lower side. The holding frame has a centering portion which, on insertion of the at least one holding frame into the recess, causes the centering portion to form a positive fit with the centering region. The at least one holding frame is thus held centered in the recess.

DE 4232902 A1 relates to a substrate holder for transporting flat disk-shaped substrates in a vacuum processing installation, in which the substrate is subjected on one side or both sides in any desired position in space to a treatment, such as, for example, sputtering or plasma etching. Two identical pairs of elastic holding fingers lie in the substrate plane. The effective direction of the holding fingers extends in the longitudinal direction to the substrate midpoint. The two pairs of holding fingers are diametrically opposite one another. The angle enclosed by the disk radii through the holding points is greater than 0° and less than 180°. The holding fingers of each pair are connected together in a friction-based manner on the side remote from the substrate via a common connecting member or via two identical prolongations. The middle of the connecting members lies on an imaginary straight line which runs through the disk midpoint and forms the force transmission location for the clamping member for introducing the clamping force of the substrate. The two clamping members move approximately along the imaginary straight line through the substrate midpoint.

DE 4024642 A1 relates to whirling plates for substrates, which whirling plates have two active surfaces and a peripheral edge protruding over those surfaces, with a plate disk carried at the center by a vertical drive shaft, with supporting blocks arranged on the surface of the plate disk, which supporting blocks have horizontal supporting surfaces and vertical supporting surfaces for the edge of the substrate, and with a vacuum bore provided axially in the drive shaft. On the surface of the plate disk there is arranged a peripheral seal, which rests against the lower side of the edge of the substrate. The vacuum bore is guided through the plate disk into a suction chamber which is formed between the plate disk and the substrate and is surrounded by the seal.

Further technological background is also illustrated in documents EP 2 075 829 B1, WO 2014 112 041 A1, WO 2015 083 211 A1, WO 2017 022 074 A1, WO 2013 108 398 A1, WO 2013 084 298 A1, WO 2012 073 285 A1, U.S. Pat. No. 9,510,460 B2, JP 49 11 714 B2, U.S. Pat. No. 7,191,511 B2, JP 55 10 923 B2, JP 57 83 652 B2, JP 2007 095 725 A, JP 2012 116 529 A, JP 2001-74664 A, JP 1-193630 A, U.S. Pat. No. 5,750,979, DE 199 13 134 A1, JP 8 227 904 A.

When a semiconductor component is detached from the substrate/a wafer film and the semiconductor component is picked up by the pick-up tool (for example vacuum pipette), position tolerances of the semiconductor component occur at the pick-up tool. This variation of the position and rotation of the components at the pick-up tool is influenced by many different parameters: adhesion between the semiconductor component and the substrate/wafer film, length of stroke of a needle for detaching the semiconductor component from the substrate/wafer film, position of the needle relative to the center of the semiconductor component, counterforce of the pick-up tool, position of the pick-up tool relative to the center of the semiconductor component on picking up the semiconductor component, intensity of the vacuum at the pick-up tool, time available for building up the vacuum for picking up the semiconductor component, nature of the surface of the semiconductor component facing the pick-up tool, nature of the surface of the pick-up tool.

Furthermore, the demands made of the semiconductor-processing industry to be able to optically detect increasingly smaller defects in the semiconductor components are increasing. Although the optical detection of defects is possible with appropriate lenses and illumination of the components to be inspected that is matched thereto, the available lenses are reaching their limits as regards the necessary image sharpness and the increasingly smaller depth of field associated therewith.

Because of the variation in the positions of the semiconductor components on the pick-up tool and the small depth of field of the lenses, the quality of the optical inspection is limited. Defects are detected with a lower probability on semiconductor components which are not imaged sharply. Defective semiconductor components are thus incorrectly not detected as being non-functional and are further processed/packaged.

Conventional solutions to this problem provide a centering station for the semiconductor component upstream of the optical evaluation, for increasing the quality of the optical component inspection. The X- and Y-position and the rotation of the semiconductor component are thereby measured. The X- and Y-position and the rotation of the semiconductor component are then corrected by moving the pick-up tool in the X- and Y-direction and rotating it. In this solution, each pick-up tool must additionally be equipped with a rotary drive or the pick-up tool is so designed that a drive can engage into each pick-up tool. Alternatively, the pick-up tool is rotated and the evaluation camera is moved in the X- and Y-direction relative to the semiconductor component. A further conventional variant provides that the semiconductor component is deposited on a carrier, the X- and Y-position and the rotation of the semiconductor component on the carrier are aligned, and then the semiconductor component is picked up from the carrier again by the pick-up tool. When the semiconductor component is picked up from the carrier again in this way, there is a risk that the semiconductor component will again slip relative to the pick-up tool.

The solution presented here is to permit precise handling of components which is improved relative to the prior art and the inspection thereof with a high throughput.

SUMMARY

To that end, a device and a method are provided. The device serves for the alignment and optical inspection of a semiconductor component located on a pick-up tool, wherein the pick-up tool is arranged on a first turning mechanism for the semiconductor component. This device for aligning is designed and adapted to align the semiconductor component relative to a center of the pick-up tool in at least one axis direction and a direction of rotation. The first turning mechanism is adapted to rotate about a first turning axis and thereby convey the semiconductor component from a first pick-up position to a first set-down position. This device for aligning is equipped with two first slides which are movable towards and away from one another and which have first slide portions oriented, for example, parallel to one another. These two first slide portions are designed and adapted to come into contact, at least in some regions, with two first side faces, which are located, for example, opposite one another, of the semiconductor component located on the pick-up tool, in order to align the semiconductor component. To that end, the first slides can push and rotate the semiconductor component in a direction perpendicular, for example, to at least one of the two first slide portions into an inspection position while the pick-up tool holds the semiconductor component.

For the optical inspection of a top face and/or of at least one of the two first side faces of the semiconductor component, a camera arrangement is provided. This camera arrangement is so aligned relative to the first turning mechanism that the pick-up tool with the semiconductor component located thereon is spaced apart from an optical means of the camera arrangement and is in alignment with an optical axis of the camera arrangement at least intermittently.

A second turning mechanism for the semiconductor component is provided and is adapted to rotate about a second turning axis. This second turning mechanism takes the semiconductor component from the first turning mechanism from the first set-down position thereof in a second pick-up position of the second turning mechanism in order to convey it to a second set-down position. The first turning axis and the second turning axis are thereby offset relative to one another by an angle of approximately 90°. The first set-down position of the first turning mechanism is in alignment with the second pick-up position of the second turning mechanism, so that the semiconductor component can be transferred from the first turning mechanism to the second turning mechanism.

In the second turning mechanism too, the semiconductor component is aligned before it is inspected. To that end, two second slides which are movable towards and away from one another are likewise provided. These second slides have second slide portions oriented, for example, parallel to one another. The two second slide portions are designed and adapted to come into contact, at least in some regions, with two second side faces, which are located, for example, opposite one another, of the semiconductor component, in order to align the semiconductor component located on the pick-up tool. As in the case of the first turning mechanism, the second slides here push and rotate the semiconductor component in a direction perpendicular, for example, to at least one of the two second slides into an inspection position while the pick-up tool holds the semiconductor component.

Aligning the semiconductor component by pushing and rotating it into an inspection position is here understood as meaning that the slide portions displace the semiconductor component on the pick-up tool to such an extent that the semiconductor component is located as far as possible within the depth of field range of the respective camera arrangement in the subsequent inspection. The semiconductor component does not have to be exactly aligned in both directions (X-axis and Y-axis) and in the direction of rotation (about the Z-axis). It is sufficient if the semiconductor component is oriented with its side faces and top face under consideration in the inspection as perpendicular as possible to the optical axis of the respective camera arrangement and is aligned wholly within the field of view of the respective camera arrangement.

In a variant, the first and/or the second slide each have a drive for changing the distance of the respective slide portions from the pick-up tools of the respective turning mechanism in the radial direction relative to the turning axis. Each slide thus has its own drive for changing a distance of the respective slide portion from an end face of the respective pick-up tools along the direction of a respective longitudinal center axis of the pick-up tools. In this manner, the positions at which the respective slide portions engage and come into contact with the sides of the semiconductor components can be set.

In a further variant, the cooperating slides on the first and/or the second turning mechanism are adapted and designed to move towards or away from the respective inspection position of the semiconductor components in the same direction and at least approximately synchronously. In this manner, the semiconductor components are pushed and rotated into the respective inspection position.

For adjustment, a camera serves in one variant to detect the distance of the slide portions from the respective end face of the pick-up tools in a direction of the respective longitudinal center axis of the pick-up tools. Thus, during operation of the arrangement, the distance of the slide portions from the respective end face of the pick-up tools can be set individually for each of the pick-up tools.

In a variant, the cooperating slides in the centering station have a "foot form", the toe of which is oriented towards the pick-up tools. A camera detects the distance from the toe to the end face of the pick-up tools. With this orientation of the toe of the slide, the camera is able to precisely detect the distance between the slide and the end face of the pick-up tool without damaging the semiconductor component.

The arrangement presented here thus forms an integrated handling/inspection device. Imaging sensors inspect all or almost all the end and/or side face(s) of a component and also provide relevant data for the positioning of the pick-up tools (manipulators, pick-up elements) and the receiving points.

This mechanism thus forms the nucleus of a closed machine system having the necessary process-engineering peripherals, for example for providing the components (for example wafer table) and component set-down (for example pocket or carrier belt).

The component-handling device presented here takes components from a component supply (wafer disk) which is arranged, for example, horizontally in the upper region of the component-handling device and has a, for example stationary, ejection unit. Relative to this ejection unit, the component supply moves in the plane. The ejection unit, by means of a needle or in a contactless manner (e.g. by means of a laser beam), causes the components to come free singly from the component supply and to be picked up by a pick-up element. The ejected components are conveyed to a plurality of inspection processes in total and finally deposited at the second set-down position. The expressions receiving point, set-down position and (deposit) pocket are here used synonymously. Reject parts can thereby be discharged. The optical examination of the component integrated into the transfer process is divided into a plurality of examination processes. It uses one or more imaging sensors in the form of camera mechanisms to optically detect end and/or lateral face(s) of a component and also the positions of the pick-up elements at the transfer/receiving points. These imaging sensors are adapted to acquire in each case at least one image of one of the end and/or lateral faces of a component in a plurality of examination processes. The feeding/transport of the components takes place while pick-up elements of turning mechanisms each hold a component. A held component passes through individual examination processes as it is being transported. An alignment of the component in at least one lateral and/or rotational direction is provided upstream of individual or all of the examination processes. Optimized precision in the acquisition of image data is thus possible. The acquired (image) data of the imaging sensors are also used for coordinating the position control of the manipulators (pick-up elements) and of the receiving points. The component feeder is adapted to feed a component along its path substantially continuously or cyclically.

The arrangement and procedure presented here functionally combines two aspects: handling and inspection. These two functions are interwoven with one another for the rapid and precise qualitative assessment of a plurality of sides (up to six or more) of the components as the components are quickly removed in singularized form from the component supply and, when classified as good parts by the inspection, deposited precisely at the receiving point or points.

The component-handling device has two approximately star- or wheel-shaped turning mechanisms which are preferably operated in a regulated manner and are arranged preferably substantially orthogonally (90° plus/minus up to 15°) relative to one another. The turning mechanisms could also have a rectangular shape. Each of these turning mechanisms carries a plurality of pick-up elements which in some variants are also movable radially relative to their axis of rotation in order to convey the components, each fixed to a pick-up element, within a pivot angle between component takeover and transfer, to one or more processing stations for inspection, discharge of reject parts and optionally further stations.

In the device presented here, the star- or wheel-shaped turning mechanisms carry the components on radially outward facing pick-up elements which are arranged on the (imaginary) periphery of the two turning mechanisms. This is in contrast to such devices in which the pick-up elements of one or both turning mechanisms are oriented parallel to the axis of rotation thereof.

While a plurality of examination processes are mentioned above, this is not intended to specify a chronological sequence or an order (first an image acquisition in a first examination process and then an image acquisition in a further examination process). In fact, cases are also conceivable in which the opposite order is more advantageous. Since a plurality of components may also be picked up simultaneously at each of the turning mechanisms, depending on the number of pick-up elements on the individual turning mechanisms, the examination processes also take place at the same time, although on different components.

The (upper/lower) end and/or (side) lateral face(s) of a component that are detected by the imaging sensors in the individual examination processes can be end and/or lateral faces of the component that differ from one another.

One aspect of the optical examination provides that the component feeder with a component completes the component path substantially without or almost without stopping. One or more end and/or lateral faces of a component are thereby detected by the imaging sensors as the component is moving or during the minimal stoppage times. These images are then evaluated by methods of image processing. A variant of this optical detection/examination provides that one or more color cameras or black and white cameras are provided as the imaging sensors.

The imaging sensors can have one or more mirrors, optical prisms, lenses or the like.

The imaging sensors can have associated radiation or light sources. Each source can be adapted to emit light/radiation with a different spectral or wavelength range for illuminating at least a portion of the component. The wavelength ranges can differ from one another, overlap or coincide at least in part. For example, the light of the first light source can be red and the light of the second light source can be blue. However, the reverse association or a different wavelength pairing (for example infrared and visible light) can also be chosen.

The light sources can each be switched on briefly by a control arrangement at the time when the pick-up element with the component is in the respective detection region, so that the end and/or lateral faces of the component can be illuminated with a brief flash of light for detection by the respective imaging sensor. Alternatively, permanent illumination can be used.

In a variant, the device has an associated delivery device which is adapted to deliver a component from the structured component supply to a pick-up element, correspondingly positioned by the controller, of the first turning mechanism. This can be a component ejector (die ejector), which pushes the component through the wafer carrier film by means of a needle, or a laser pulse generator, which purposively reduces the adhesive force of the component on the carrier film and thus releases the component from the carrier film. The delivery device has an associated position and/or property sensor which is adapted to detect the position of the delivery device relative to the component to be delivered and/or position data of the component to be delivered and/or properties of the component to be delivered, and to provide them to the controller for operation of the delivery device.

In a variant, the pick-up elements of the first and/or second turning mechanism in the device are adapted to be deployed and retracted in a controlled manner radially to the axis of rotation or the center of rotation of the respective turning mechanism, and/or to be subjected to negative pressure and/or excess pressure in a controlled manner in order to receive and deliver a component to be fed, and/or to be immovable about their respective radial movement axis, or to be rotated in a controlled manner through an angle of rotation about their respective radial movement axis.

In a variant of a device of this type, the pick-up elements of the first and/or second turning mechanism are provided with associated linear drives for radial deployment/retraction at the dispensing point, the transfer point between the first and second turning mechanisms. These linear drives engage with the correspondingly positioned pick-up elements from outside the respective turning mechanisms and radially deploy or retract the respective pick-up element. In another variant, these linear drives only deploy the respective pick-up element, while a return spring retracts the respective pick-up element. In a further variant, each of the pick-up elements has an associated bidirectional or unidirectional radial drive.

In a variant of the component-handling device, valves provide each of the individual pick-up elements, individually and in the correct position, with negative pressure and excess pressure in order to perform the following functions, freely or in a position-controlled manner: (i) suction of the component, (ii) holding of the component, (iii) deposition of the component with or without a controlled blow-off pulse, and/or free blowing-off of the component.

In a variant of the device, position and property sensors are associated with the first turning mechanism between the dispensing point and the transfer point and/or with the second turning mechanism between the transfer point and the deposit point. These sensors are adapted to detect position data and/or properties of the fed component and/or position data for regulating the position of the manipulators (pick-up elements) and of the receiving points, and to provide them to the controller.

In a variant of the device, at least some of the position and property sensors are adapted to inspect at least one end face and/or one or more lateral faces of the fed component in order to detect the position data and/or properties thereof and provide them to the controller.

In a variant of the component-handling device, a whole number of n pick-up elements is associated with the first and/or the second turning mechanism. n is thereby $>=2$. The number of pick-up elements of the first turning mechanism and the number of pick-up elements of the second turning mechanism can be the same or different.

In a variant of the component-handling device, the first, second and/or third axes enclose an angle relative to one another of in each case 90° plus/minus not more than 10° or 15°.

In a variant of the device, the position/property sensors are imaging sensors having corresponding or different detection spectra, or position sensors which measure distance by contact or without contact, or property sensors which detect by contact or without contact.

The position and property sensors can be imaging sensors with straight or bent optical axes.

The camera systems of the position and property sensors, including their mirror and illumination units, can be so combined by their spatial arrangement that the component inspection of the facing component face and of two of its lateral faces can be carried out in parallel at a single processing position. In total, two processing positions (at each turning mechanism) are thus sufficient for the complete inspection of all six side faces of, for example, a quadrangular component. To that end, three of the six side faces of the component are detected at each of the two processing positions. As the inspection position of each turning mechanism, the respective third processing position can in a variant be fixed approximately horizontally at the level of the axis of rotation or pivot axis. Component centering is provided temporally and spatially upstream of each of these inspection positions.

Additional position-measuring functions can be allocated to two further camera systems (front/rear camera).

In a variant of the component-handling device, the first and/or second turning mechanisms are at least approximately star- or wheel-shaped. The turning mechanisms can be precision-mounted, and their positioning along the respective axes or about the respective axes can take place by means of an axially arranged drive acting linearly or rotationally, paired with a high-resolution (for example rotary or linear) encoder. The pick-up elements can be distributed on the outer periphery and have radially outward facing suction contact points for the components to be conveyed.

An advantage of arranging the turning mechanisms offset axially by approximately 90° to one another is that the components perform a 90° turn about the pick-up element axis, relative to the particular movement plane of the pick-up elements (or turning mechanism axis), in their position during the feeding process as they are transferred from one turning mechanism to the next, without the pick-up element itself having to be mounted in a rotationally movable manner. This change in orientation of the components in turn permits substantially simplified inspection of the four component cut faces (=component side faces). There is used for this purpose a camera system facing the component cut face and arranged orthogonally to the pick-up element movement plane (that is to say in the axial direction of the turning mechanism) at preferably a very small distance from the component cut faces (=lateral faces of the component) themselves.

Detection of the incorrect positioning of a pick-up element and a component relative to one another or to the transfer and inspection positions is carried out using the camera systems as a pick-up element or component position detecting measuring system. Where the requirements in terms of accuracy are very high, three distance-measuring sensors can additionally be provided for each turning mechanism for bond tool position detection.

The optical axes of the cameras "penetrate" the inspected component surface. They form a reference system for the pick-up element position. On the basis thereof, deviations of the pick-up element movement path from the target movement path can be determined by the distance-measuring sensors arranged in a plane parallel to the ideal pick-up sensor movement plane of the rotating turning mechanism. Position errors that occur in the transfer positions can be determined therefrom and compensated for by the controller.

The variants presented here are less expensive compared to the prior art and offer a higher component throughput, more time for inspections and have fewer moving masses.

BRIEF DESCRIPTION OF THE DRAWINGS

Further features, properties, advantages and possible modifications will be clear to a person skilled in the art from the following description, in which reference is made to the accompanying drawings. The figures show, in schematic form, an optical inspection device for a component.

FIG. 1 is a side view, in schematic form, of a device for aligning and optically inspecting a semiconductor component, which device conveys a turning mechanism from a pick-up position into a set-down position.

FIG. 1a is a top view, in schematic form, in the direction of the arrow AA, of the device for aligning the semiconductor component of FIG. 1.

FIG. 1b is a view, in schematic form, in the direction of the arrow BB, of the device for optically inspecting the semiconductor component of FIG. 1.

FIG. 2 is a view, in schematic form, of the device for aligning and optically inspecting the semiconductor component with two cooperating turning mechanisms rotated through 90° relative to one another.

FIG. 3a-3c are top views, in schematic form, in the direction of the arrow CC, of the alignment of the semiconductor component in FIG. 1 or 2 for subsequent optical inspection.

DETAILED DESCRIPTION OF THE EMBODIMENTS

FIG. 1 shows a component-handling device 100 for removing prismatic components B in the form of electronic semiconductor chips from a component supply and for depositing them at a receiving device 200. The component-handling device 100 presented here takes the components B from a component supply BV, not shown in greater detail, for example a wafer disk, arranged horizontally in the upper region of the component-handling device 100.

An ejection unit 110 works in the variant shown with a needle controlled by a controller, or it works, for example, in a contactless manner with a laser beam, in order to free the components B singly from the component supply BV so that they are conveyed to a first turning mechanism 130. This first turning mechanism 130 has the shape of a star or wheel and has on its periphery a plurality of pick-up elements 132 (in the example shown eight) for the singularized components B. Each of the pick-up elements 132 is adapted, when it is situated at the 0° position of the first turning mechanism 130 nearest the ejection unit 110, to receive a component from the structured component supply BV at a first pick-up position.

The pick-up elements 132 are arranged facing radially outwards on the (imaginary) periphery of the star- or wheel-shaped first turning mechanism 130 and carry the components B taken from the component supply BV. In the variant shown, the pick-up elements 132 are radially movable relative to the axis of rotation of the first turning mechanism 130. The pick-up elements 132 are thus able to feed the components B, each fixed to one of the pick-up elements 132, within a pivot angle—here between 0° and 180°—between component takeover and transfer.

The first turning mechanism 130 rotates the component B, controlled by the controller not shown in greater detail, through a first predetermined angle, here 180°, about its axis of rotation to a first transfer point. The component B is thereby turned about its longitudinal or transverse axis. A second turning mechanism 150 similar to the first turning mechanism 130 and having a plurality of second pick-up elements 152, here likewise eight pick-up elements, is adapted to receive the component B at the transfer point from a pick-up element 132 of the first turning mechanism 130 when the component is situated at the 0° position of the second turning mechanism 150 nearest the transfer point, as is shown schematically in FIG. 2.

The second turning mechanism 150 turns the received component B, controlled by the controller, about its axis of rotation through a second predetermined angle, here through approximately 180°, about its longitudinal or transverse axis and feeds it to a deposit point in the receiving device 200.

The axes of rotation of the first and second turning mechanisms 130, 150 each enclose an angle of 90° plus/minus not more than 10° or 15° with one another and are oriented according to a three-dimensional orthogonal coordinate system.

The two star- or wheel-shaped turning mechanisms 130, 150 are arranged orthogonally to one another and otherwise correspond in terms of their construction. In a departure from the representation in FIG. 1, the arrangement of the two turning mechanisms 130, 150 relative to the feed direction of the receiving device 200 can also be rotated through 90° about the Z-axis. In this case, the lower turning mechanism 150 is oriented at least approximately transversely to the feed direction of the receiving device 200.

The first and second turning mechanisms 130, 150 have associated position and property sensors in the form of camera arrangements. As shown in FIG. 1, these sensors are situated at a plurality of points of the arrangement as a whole. They are adapted to detect position data of the first and second turning mechanisms 130, 150, position data of components B situated on the pick-up elements 132, 152, and also properties of components B situated on the pick-up elements 132, 152. The data thereby obtained are provided to the controller. In the embodiment illustrated here, a first camera arrangement K1 with three cameras K1-1, K1-2, K-3—visible only in part in FIG. 1—at the periphery of the first turning mechanism 130 is directed at 90° at the component B guided past thereon. Details of this camera arrangement K1 will be explained in connection with FIG. 1b. A camera arrangement K2 with three cameras corresponding to the camera arrangement K1 at the periphery of the second turning mechanism 150 is directed at 90° at the component B guided past thereon (see FIG. 2).

The controller is adapted to rotate the first turning mechanism 130 in a controlled manner about its axis of rotation by means of a rotary drive DA1 and to move the first turning mechanism 130 in a controlled manner along its axis of rotation by means of a linear drive LA1. Analogously, the second turning mechanism 150 has a rotary drive and a linear drive which are not shown in greater detail.

The imaging sensors inspect the end and/or side face(s) of the component B and also provide relevant data for the positioning of the first and second turning mechanisms 130, 150 along and about their axes, and also the pick-up elements 132, 152 and the components B situated thereon.

For sucking the component B into the pick-up elements 132, 152, for holding the component B in the pick-up elements 132, 152, for depositing the component B with or without a controlled blow-off pulse, and for freely blowing the component B out of the pick-up elements 132, 152, the pick-up elements are connected to a pneumatic unit, not shown in greater detail. The pneumatic unit, controlled by the controller, applies excess or negative pressure to the individual pick-up elements 132, 152, under the control of a valve, at the required point in time or time period in order to pick up the components B singly, hold them and deposit them again.

Before a component B is fed to an imaging sensor, for example in the form of the camera arrangement K1-1 . . . K1-3 (see FIG. 1b) in the 90° position in FIG. 1 for inspection of the end and/or side face(s) of the component B, a device 300 for aligning the semiconductor component B located on the pick-up tool 132, 152 ensures that it is optimally aligned for inspection by the camera arrangement K1-1 . . . K1-3. This is to ensure that even very small optical component defects can be detected. For this purpose, the camera arrangement K1-1 . . . K1-3 has specially adapted lenses and illumination which is adapted to the faces to be inspected in terms of radiation intensity and light wavelength. For the necessary imaging sharpness, the depth of field of the lenses lies within a very narrow range. To that end, the side faces of the semiconductor component B that are to be inspected are aligned as precisely as possible with the focal distance FA (see FIG. 1, 3c) of the respective camera arrangement K1-1 . . . K1-3. In addition, the cooperating slide portions urge the side faces of the semiconductor component B that are to be inspected in the direction towards the inspection position to such an extent that those side faces and also the top face are located in the depth of field ranges STB (see FIG. 1, 3c) of the respective camera arrangement K1-1 . . . K1-3. In one embodiment, the chromatic aberration of the lenses between the IR light range and the blue light range is minimized. For example, the lenses of the camera arrangement K1-1 . . . K1-3 additionally have a viewing distance from the side faces of the semiconductor component B that are to be inspected of approximately 104.1 mm, plus approximately 2 mm, minus approximately 1 mm, and a depth of field range STB of approximately 0.1 mm.

In order to be able to optically inspect the semiconductor component B located on the pick-up tool 132, 152 optimally, the device 300 for aligning the semiconductor component B is used. The device 300 aligns the semiconductor component B relative to a center of the pick-up tool in at least one axis direction (x-axis or y-axis) transversely to the center longitudinal axis (z-axis) of the respective pick-up tool 132, 152 and/or a direction of rotation along the center longitudinal axis (z-axis) of the respective pick-up tool 132, 152.

To that end, the turning mechanism 130, 150, while it rotates about its axis of rotation, conveys the semiconductor component B from a pick-up position (at 0°) into a set-down position (at 180°). In FIGS. 1 and 2, alignment takes place at approximately 45°. There are arranged there two mutually aligned first slides 140-1 and 140-2 which are movable towards and away from one another and between which the semiconductor component B is conveyed. The slides 140-1 and 140-2 have slide portions 142-1, 142-2 which have a contour adapted to the form of the side face of the semiconductor component B, so that the two slide portions 142-1, 142-2 are suitable for coming into contact with two first side faces B1, B3 of the semiconductor component B. As illustrated in FIG. 3a-3c, the two slide portions 142-1, 142-2 to be moved towards one another urge the semiconductor component B located on the pick-up tool 132, 152 into an aligned inspection position while the pick-up tool 132, 152 holds the semiconductor component B.

As illustrated in FIG. 1b, an image acquisition is performed by the camera arrangement K1-1 . . . K1-3 at the first turning mechanism 130 in the inspection position (at 90° in FIG. 1) for the optical inspection of the top face S1 remote from the pick-up tool 132 and the two side faces B1, B3 (see FIG. 1b) of the semiconductor component B when the semiconductor component B is in the inspection position (at 90°). Analogously thereto, an image acquisition is performed by the camera arrangement K2-1 . . . K2-3 at the second turning mechanism 150 in the inspection position (likewise at 90°) for the optical inspection of the top face S1 remote from the pick-up tool 152 and the two side faces B2, B4 of the semiconductor component B when the semiconductor component B is in the inspection position (at 90°). To that end, it is provided that the pick-up tool 132, 152 on the respective turning mechanism 130, 150 is so arranged and aligned that, with the semiconductor component B located thereon, it is spaced apart from an optical means (for example the mirrors SP1 and SP2) or the lens of the respective camera arrangement K1-1 . . . K1-3, K2-1 . . . K2-3 and is in alignment with an optical axis of the camera arrangement K1-1 . . . K1-3, K2-1 . . . K2-3 at least intermittently.

The first and second turning mechanism 130, 150 are identical in construction have first and second slides 140-1, 140-2; 160-1, 160-2 (see FIG. 1, 2) which are movable towards and away from one another and which are likewise identical in construction. Each of the first and second slides has a drive for changing the distance of the respective slide portions 142-1, 142-2; 162-1, 162-2 from the pick-up tools 132, 152 of the respective turning mechanism 130, 150 along the center longitudinal axis (z-axis) of the pick-up tools 132, 152, that is to say in the radial direction relative to the axis of rotation or turning axis of the respective turning mechanism 130, 150.

For adjustment, a camera K3 serves to detect the distance of the slide portions 142-1, 142-2; 162-1, 162-2 from the respective end face of the pick-up tools 132, 152 in a direction of the respective longitudinal center axis of the pick-up tools. Thus, during operation of the arrangement, the distance of the slide portions 142-1, 142-2; 162-1, 162-2 from the respective end face of the pick-up tools 132, 152 can be set individually for each of the pick-up tools 132, 152. This permits precise alignment of the semiconductor component B in the inspection position.

Each slide additionally has its own drive for moving the cooperating slides with their slide portions 142-1, 142-2; 162-1, 162-2 with the respective semiconductor component B between them, see also FIG. 3a-3c, on the first and second turning mechanism 130, 150 towards or away from the respective inspection position in the same direction and at least approximately synchronously.

In the variant illustrated here, the cooperating slides in the centering station have a "foot form", the toe of which is oriented towards the end faces of the pick-up tools 132, 152. The camera K3 detects the distance from the toe to the radially outer end face of the pick-up tools 132, 152.

By inspecting the semiconductor component B first at the first and then at the second turning mechanism 130, 150, in conjunction with the prior alignment of the semiconductor component B, all four side faces B1-B4 and the two top faces S1, S2 are accessible for optical inspection.

The first and the second camera arrangements K1 and K2, as position and property sensors, are directed with their respective three cameras at the periphery of the first or second turning mechanism 130, 150 at approximately 90° at the three sides B1, B3 and S1 of the component B or at the three sides B2, B4 and S2 of the component B, respectively.

A top view of the camera arrangement K1 or K2 with its three cameras K1-1, K1-2 and K1-3; K2-1, K2-2 and K2-3 is shown in FIG. 1b. The middle camera inspects the respective end face S1 or S2 of the component B and the two outer cameras, via respective mirrors SP1 and SP2, inspect the side faces of the component B. Any faults in the component B on those faces can be determined from the image acquisitions thus acquired.

The invention claimed is:

1. A device for aligning and optically inspecting a semiconductor component located on a pick-up tool, wherein
the pick-up tool is arranged on a first turning mechanism for the semiconductor component, and
wherein the device is designed and adapted to align the semiconductor component relative to a center of the pick-up tool in at least one axis direction and/or a direction of rotation, wherein
the first turning mechanism is adapted to rotate about a first turning axis and thereby convey the semiconductor component from a first pick-up position to a first set-down position, with
two first slides which are movable towards and away from one another and which have first slide portions, wherein
the two first slide portions are designed and adapted to come into contact, at least in some regions, with two first side faces of the semiconductor component, so that the two first slide portions align the semiconductor component located on the pick-up tool in that the first slides are designed and adapted to push and/or rotate the semiconductor component into an inspection position while the pick-up tool holds the semiconductor component.

2. The device as claimed in claim 1, wherein, for the optical inspection of a top face remote from the pick-up tool and/or of at least one of the two first side faces of the semiconductor component, there is provided a camera arrangement which is so aligned relative to the first turning mechanism that the pick-up tool with the semiconductor component located thereon is spaced apart from an optical means of the camera arrangement and is in alignment with an optical axis of the camera arrangement at least intermittently.

3. The device as claimed in claim 1, wherein a second turning mechanism for the semiconductor component is provided, which turning mechanism is adapted to rotate about a second turning axis and thereby take the semiconductor component from the first turning mechanism from the first set-down position thereof in a second pick-up position of the second turning mechanism in order to convey the semiconductor component to a second set-down position, wherein the first turning axis and the second turning axis are offset relative to one another by an angle of approximately 90°, and wherein the first set-down position of the first turning mechanism is in alignment with the second pick-up position of the second turning mechanism, so that the semiconductor component can be transferred from the first turning mechanism to the second turning mechanism.

4. The device as claimed in claim 3, wherein the second turning mechanism for the semiconductor component
has two second slides which are movable towards and away from one another and which have second slide portions oriented parallel to one another, wherein
the two second slide portions are designed and adapted to come into contact, at least in some regions, with two second side faces, which are located opposite one another, of the semiconductor component, so that the two second slide portions align the semiconductor component located on a pick-up tool of the second turning mechanism in that the second slides push the semiconductor component in a direction perpendicular to the two second slide portions into an inspection position and/or rotate it into the inspection position while the pick-up tool of the second turning mechanism holds the semiconductor component.

5. The device as claimed in claim 4, wherein the first and/or the second slides have a drive which causes the first and/or second slides to change the distance of the respective slide portions from the pick-up tools of the respective turning mechanism in the radial direction relative to the respective turning axis.

6. The device as claimed in claim 5, wherein each slide has its own drive which causes a distance of the respective slide portion from an end face of the respective pick-up tools along the direction of a respective longitudinal center axis of the pick-up tools to change.

7. The device as claimed in claim 4, wherein the cooperating slides on the first and/or the second turning mechanism are adapted and designed to move towards or away from the respective inspection position in the same direction and at least approximately synchronously.

8. The device as claimed in claim 4, wherein there is provided a camera which is designed to detect the distance of the slide portions from the respective end face of the pick-up tools in a direction of the respective longitudinal center axis of the pick-up tools.

9. A method for aligning and optically inspecting a semiconductor component located on
a pick-up tool,
the method comprising:
arranging the pick-up tool on a first turning mechanism for the semiconductor component,
aligning the semiconductor component relative to the center of the pick-up tool in at least one axis direction and/or a direction of rotation,
rotating the semiconductor component about a first turning axis,
conveying the semiconductor component thereby from a first pick-up position to a first set-down position, and
moving two first slides towards and away from one another and have first slide portions which come into contact, at least in some regions, with two first side faces of the semiconductor component, so that the two first slides align the semiconductor component located on the pick-up tool such that the first slides push and/or rotate the semiconductor component into an inspection position while the pick-up tool holds the semiconductor component.

10. The method as claimed in claim 9, wherein a top face remote from the pick-up tool and/or at least one of the two first side faces of the semiconductor component are inspected by means of a camera arrangement which is so aligned relative to the first turning mechanism that the pick-up tool with the semiconductor component located thereon is spaced apart from an optical means of the camera arrangement and is in alignment with an optical axis of the camera arrangement at least intermittently.

11. The method as claimed in claim 9, wherein a second turning mechanism rotates about a second turning axis and thereby takes the semiconductor component from the first turning mechanism from the first set-down position thereof in a second pick-up position of the second turning mechanism for conveying the semiconductor component to a second set-down position, wherein the first turning axis and the second turning axis are offset by an angle of approximately 90° relative to one another, and wherein the first set-down position of the first turning mechanism is in alignment with the second pick-up position of the second turning mechanism so that the semiconductor component can be transferred from the first turning mechanism to the second turning mechanism.

12. The method as claimed in claim 11, wherein the same means are associated with the second turning mechanism for the semiconductor component for alignment and optical inspection, which means cause the semiconductor component located on the pick-up tool to be aligned in that the semiconductor component is pushed and/or rotated into an inspection position while the pick-up tool holds the semiconductor component.

13. The method as claimed in claim 12, wherein the distance of the respective slide portions from the pick-up tools of the respective turning mechanism in the radial direction, relative to the turning axis, is changed.

14. The method as claimed in claim 12, wherein the cooperating slides on the first and/or the second turning mechanism move towards or away from the respective inspection position in the same direction and at least approximately synchronously.

* * * * *